United States Patent
Yamada et al.

(10) Patent No.: US 7,158,898 B2
(45) Date of Patent: Jan. 2, 2007

(54) METHOD OF CALCULATING EFFECTIVE POWER RELATING TO CAPACITOR, METHOD OF MEASURING EFFECTIVE POWER CONSUMED BY CAPACITOR, CAPACITOR SELECTION METHOD, CALCULATION APPARATUS FOR CALCULATING EFFECTIVE POWER RELATING TO CAPACITOR, AND RECORDING MEDIUM STORING THE CALCULATION PROGRAM THEREFOR

(75) Inventors: Hirohisa Yamada, Izumo (JP); Osamu Yamaoka, Izumo (JP); Kazuyuki Kubota, Izumo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 15 days.

(21) Appl. No.: 10/718,797

(22) Filed: Nov. 24, 2003

(65) Prior Publication Data

US 2004/0167730 A1   Aug. 26, 2004

(30) Foreign Application Priority Data

Nov. 22, 2002 (JP) ............................. 2002-339108
Oct. 31, 2003 (JP) ............................. 2003-373119

(51) Int. Cl.
*G01R 21/00* (2006.01)

(52) U.S. Cl. ..................................................... 702/60

(58) Field of Classification Search ................. 702/60;
324/427, 650; 219/216; 331/96; 333/182;
320/107, 106, 132; 361/331, 321; 374/175;
417/12; 422/88
See application file for complete search history.

(56) References Cited

U.S. PATENT DOCUMENTS

| | | | | |
|---|---|---|---|---|
| 4,725,784 A | * | 2/1988 | Peled et al. | ................. 324/427 |
| 2002/0039272 A1 | * | 4/2002 | Mizuno et al. | ............. 361/311 |

FOREIGN PATENT DOCUMENTS

| | | |
|---|---|---|
| EP | 1 035 626 | 9/2000 |
| GB | 1 395 045 | 5/1975 |
| JP | 2002-22779 | 1/2002 |
| JP | 2002 0227799 | 1/2002 |
| KR | 1997-0013652 | 3/1997 |
| KR | 1999-0023815 | 3/1999 |

OTHER PUBLICATIONS

METAMORPHOSIS, "Ceramic Capacitors: Murata's Starting Point The Path to One Trillion," Metamorphosis, vol. 4, Dec. 1998, pp. 26-27.
Seiji Jodai, "Selection Assistance Tool for Low-Loss Medium Voltage Ceramic Capacitors and Components for High-Frequency Applications", Special Feature 2003 Edition Switching Power Supply Handbook, 2003-2004, pp. 68-71.
Official Communication issued in corresponding Chinese Application No. 200310118060.5. Dated Feb. 24, 2006.

* cited by examiner

*Primary Examiner*—John Barlow
*Assistant Examiner*—Tung S. Lau
(74) *Attorney, Agent, or Firm*—Keating & Bennett, LLP

(57) ABSTRACT

In a method of calculating effective power relating to a capacitor, the waveform of a periodic voltage applied to a capacitor is set. The capacitance of a desired capacitor is input. The waveform of the periodic voltage applied to both ends of the capacitor is subjected to Fourier expansion. More specifically, the periodic voltage is Fourier-expanded in terms of sine and cosine-wave series of high-order frequency components. Further, an effective power consumed by the capacitor is calculated using data regarding temperature characteristics, voltage characteristics and a frequency characteristic of the capacitance and dielectric tangent of the capacitor.

4 Claims, 14 Drawing Sheets

FIG. 7

METHOD OF CALCULATING EFFECTIVE POWER RELATING TO CAPACITOR, METHOD OF MEASURING EFFECTIVE POWER CONSUMED BY CAPACITOR, CAPACITOR SELECTION METHOD, CALCULATION APPARATUS FOR CALCULATING EFFECTIVE POWER RELATING TO CAPACITOR, AND RECORDING MEDIUM STORING THE CALCULATION PROGRAM THEREFOR

BACKGROUND OF THE INVENTION

1. Field of the Invention

The present invention relates to a method of calculating effective power relating to a capacitor, a method of measuring effective power consumed by the capacitor, a capacitor selection method, a calculator for calculating the effective power consumed by the capacitor, and a recording medium storing the calculation program therefor.

2. Description of the Related Art

Previously, capacitors have been used as electric circuits, such as a snubber circuit of a switching power supply, a horizontal resonant circuit of a color television, and other suitable circuits, in which a desired periodic pulse voltage of a desired waveform other than a sine waveform is applied. In this case, it is necessary to determine an allowable power capacity of the capacitor so as to suppress the heat generated by the capacitor below the allowable capacity, whereby the capacitors do not experience problems (decreased life or destruction due to thermal runaway) caused by self heating due to a dielectric loss. In general, apparent power that can be easily measured is used as the allowable power capacity. This apparent power is obtained by multiplying the effective value of a voltage applied to the capacitor by the effective value of a current flowing into the capacitor. If the waveform of the voltage applied to the capacitor is a sine waveform, the apparent power is easily measured.

However, where a predetermined periodic pulse voltage of a predetermined waveform other than a sine waveform is applied to the capacitor, it is difficult to measure the effective value of the voltage applied to the capacitor and the effective value of the current flowing into the capacitor. Furthermore, since the capacitance and dielectric tangent of the capacitor are dependent on the voltage and frequency thereof, it is difficult to calculate the capacitance and dielectric tangent.

Therefore, Applicants had proposed a method of obtaining apparent power Pa corresponding the original voltage waveform, by Fourier expanding the waveform of a periodic pulse voltage applied to a capacitor in terms of harmonic sine and cosine-wave series of high-order frequency components and calculating the sum of apparent powers $Pa_n$ for each of the harmonics. This method is disclosed in Japanese Unexamined Application Publication No. 2002-22779 (Patent Document 1).

However, the above-described method disclosed in Patent Document 1 has the following problems.

Effective power Pe consumed by the capacitor is equal to the product of the dielectric tangent and apparent power Pa of the capacitor (effective power Pe=dielectric tangent× apparent power Pa). If the dependency of the dielectric tangent on temperature, voltage, and frequency is low enough to function as a constant, the sum of effective powers $Pe_n$ calculated for each of the harmonics is equal to the product of the sum of the apparent powers $Pa_n$ and the dielectric tangent ($\Sigma$ (effective powers $Pe_n$)=dielectric tangent×$\Sigma$ (apparent powers $Pa_n$)). Subsequently, the apparent power Pa may be used as a substitute characteristic of the effective power Pe consumed by the capacitor.

However, if the dependency of the dielectric tangent on temperature, voltage, and frequency is so high that the dielectric tangent cannot function as the constant, the sum of effective powers $Pe_n$ calculated for the harmonics is not equal to the product of the sum of the apparent powers $Pa_n$ and the dielectric tangent ($\Sigma$ (effective powers $Pe_n$)≠dielectric tangent×$\Sigma$ (apparent powers $Pa_n$)). Subsequently, the apparent power Pa cannot be used as a substitute characteristic of the effective power Pe consumed by the capacitor.

SUMMARY OF THE INVENTION

To overcome the problems described above, preferred embodiments of the present invention provide a method of calculating the effective power that is actually consumed by the capacitor from the capacitance, dielectric tangent, and periodic voltage waveform of the capacitor. Preferred embodiments of the present invention also provide a method of measuring the effective power consumed by the capacitor, a capacitor selection method, a calculator for calculating the effective power relating to the capacitor, and a recording medium storing the calculation program therefor.

A preferred embodiment of the present invention provides a method of calculating the effective power of a capacitor, which includes the steps of obtaining an equilibrium temperature of the capacitor for each of a plurality of sine waves, substituting a first capacitance and a first dielectric tangent of the capacitor for each of the equilibrium temperatures into the following equation:

$$Pe = \frac{\tan\delta}{1 + (\tan\delta)^2} \cdot \pi f C b^2$$

Pe: effective power
tan δ: dielectric tangent
C: capacitance
f: frequency
b: sine-wave amplitude Subsequently, a first effective power (a regression value) for each of the equilibrium temperatures is determined. The method further includes the steps of obtaining a voltage value and a frequency from the waveform of a periodic voltage applied to both ends of the capacitor, setting a plurality of provisional temperatures, obtaining a second capacitance and a second dielectric tangent for each of the provisional temperatures, and substituting the second capacitance and the second dielectric tangent into the following equation:

$$Pe = \frac{\tan\delta}{1 + (\tan\delta)^2} \cdot \pi f C (a^2 + b^2)$$

Pe: effective power
tan δ: dielectric tangent
C: capacitance
f: frequency
a: cosine-wave amplitude
b: sine-wave amplitude Subsequently, a second effective power (a calculation value) corresponding to the periodic voltage for each of the provisional temperature is obtained. This method further includes the steps of determining a temperature at which the first effective power (the regression value) is approximately equal to the second effective power (the calculation value) as a target equilibrium temperature of the capacitor, and determining the first and second effective powers corresponding to this target equilibrium temperature as a target effective power corresponding to the periodic voltage.

More particularly, in the step of calculating the second effective power (the calculation value), Fourier expansion is performed for the periodic voltage, and effective power is calculated for each harmonic. Then, the sum of the calculated effective powers of the harmonics is determined as the second effective power (the calculation value) corresponding to the periodic voltage.

Another preferred embodiment of the present invention provides a method of measuring effective power consumed by a capacitor. A periodic voltage is applied to the capacitor and the waveform of the periodic voltage applied to both ends of the capacitor is measured. Further, the effective power consumed by the capacitor is calculated from the measured waveform of the periodic voltage, by using the method of calculating the effective power of the capacitor.

Another preferred embodiment of the present invention provides a capacitor selection method. This method includes the steps of obtaining an equilibrium temperature of the capacitor for each of a plurality of sine waves and substituting a first capacitance and a first dielectric tangent of the capacitor for each of the equilibrium temperatures into the following equation:

$$Pe = \frac{\tan\delta}{1+(\tan\delta)^2} \cdot \pi f C b^2$$

Subsequently, first effective power (a regression value) for each of the equilibrium temperatures is obtained. This method further includes the steps of obtaining a voltage value and a frequency from the waveform of a periodic voltage applied to both ends of the capacitor, setting a plurality of provisional temperatures, obtaining a second capacitance and a second dielectric tangent for each of the provisional temperatures, and substituting the second capacitance and the second dielectric tangent into the following equation:

$$Pe = \frac{\tan\delta}{1+(\tan\delta)^2} \cdot \pi f C (a^2 + b^2)$$

Subsequently, a second effective power (a calculation value) corresponding to the periodic voltage is obtained for each of the provisional temperatures. This method further includes the steps of determining a temperature at which the first effective power (the regression value) is approximately equal to the second effective power (the calculation value) as a target equilibrium temperature of the capacitor, determining the first and second effective powers corresponding to this target equilibrium temperature as a target effective power corresponding to the periodic voltage, and comparing the target effective power corresponding to the periodic voltage with an allowable power capacity of the capacitor for determining whether or not the capacitor is available.

Another preferred embodiment of the present invention provides a calculation apparatus for calculating effective power relating to a capacitor. The calculation apparatus includes a calculator. This calculator stores data regarding capacitances and dielectric tangents of a plurality of capacitors. The capacitances and the dielectric tangents are determined based on a voltage characteristic, a frequency characteristic, and a temperature characteristic of the capacitors. This calculator also stores data regarding the first effective power (a regression power) for each of equilibrium temperatures of the capacitors. When a predetermined capacitance required for an electric circuit using one of the capacitors and the waveform of a periodic voltage applied to both ends of the capacitor are input, the calculator calculates the second effective power (a calculation value) at a plurality of provisional temperatures from the input waveform of the periodic voltage. Then, the calculator determines a predetermined temperature at which the first effective power (the regression value) is approximately equal to the second effective power (the calculation value) as a target equilibrium temperature of the capacitor. The calculator further determines the first effective power and the second effective power corresponding to the target equilibrium temperature as a target effective power corresponding to the periodic voltage. The calculator compares a stored allowable power of the capacitor with the target effective power corresponding to the periodic voltage for determining whether or not the capacitor is available.

Another preferred embodiment of the present invention provides a recording medium for storing the program for calculating effective power relating to a capacitor by using a computer. The calculation program stores data regarding capacitances and dielectric tangents of a plurality of capacitors. The capacitances and the dielectric tangents are determined based on a voltage characteristic, a frequency characteristic, and a temperature characteristic of the capacitors. The calculation program also stores data on the first effective power (a regression value) for each of equilibrium temperatures of the capacitors. When a predetermined capacitance required for an electric circuit using one of the capacitors and the waveform of a periodic voltage applied to both ends of the capacitor are input, the program calculates the second effective power (a calculation value) at a plurality of provisional temperatures from the input waveform of the periodic voltage. The calculation program determines a predetermined temperature at which the first effective power (the regression value) is approximately equal to the second effective power (the calculation value) as a target equilibrium temperature of the capacitor. The calculation program further determines the first effective power and the second effective power corresponding to the target equilibrium temperature as a target effective power corresponding to the periodic voltage. The calculation program compares a stored allowable power of the capacitor to the target effective power corresponding with the periodic voltage for determining whether or not the capacitor is available.

According to the above-described preferred embodiments, the effective power consumed by a capacitor used for an electric circuit to which a predetermined periodic voltage waveform from the capacitance and dielectric tangent of the capacitor and the periodic voltage waveform applied to both ends of the capacitor is obtained.

Therefore, according to the preferred embodiments of the present invention, the effective power consumed by the capacitor is quickly, precisely, and reliably obtained. Further, the effective power of the capacitor is obtained, where the effective power corresponds to a predetermined periodic voltage applied to the capacitor, even when an electric circuit is not actually provided.

The above and other elements, characteristics, features, steps, and advantages of the present invention will become clear from the following description of preferred embodiments taken in conjunction with the accompanying drawings.

BRIEF DESCRIPTION OF THE DRAWINGS

FIG. 7 illustrates an example of initial image displayed when the calculation apparatus is started;

DETAILED DESCRIPTION OF PREFERRED EMBODIMENTS

A method of calculating effective power related to a capacitor, a method of measuring the effective power consumed by the capacitor, a capacitor selection method, a calculation apparatus for calculating the effective power related to the capacitor, and a recording medium storing the calculation program therefor according to preferred embodiments of the present invention will now be described with reference to the accompanying drawings.

First, an electric circuit to which a periodic voltage is applied is prepared. In this preferred embodiment, a snubber circuit of a switching field effect transistor (FET) of a switching power supply is preferably provided as the electric circuit. Further, a ceramic capacitor having a capacitance value of about 470 pF and a rated voltage of about DC 1 kV is preferably provided as a capacitor for evaluation.

Figure 1:
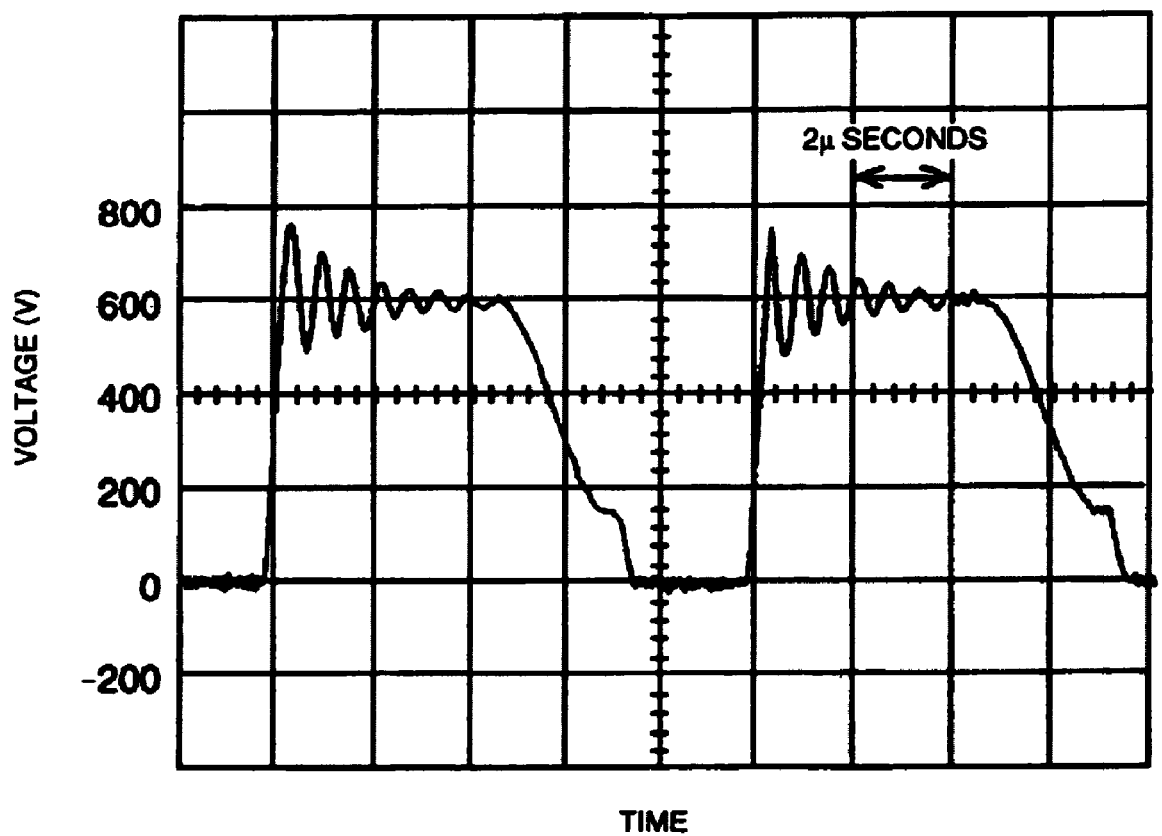
FIG. 1 is a graph illustrating an example waveform of a periodic voltage applied to a capacitor.

A periodic pulse voltage V(t) is applied to the ceramic capacitor. The waveform of the periodic pulse voltage V(t) is determined so as not to be a sine waveform. According to this preferred embodiment, the waveform of the periodic pulse voltage V(t) applied to both ends of the ceramic capacitor is measured using an oscilloscope. Subsequently, trapezoidal waves having a frequency of about 99.6 kHz and a peak to peak (p-p) value V of about 778 volts are obtained, as shown in FIG. 1.

Next, the waveform of the periodic pulse voltage V(t) applied to the both ends of the ceramic capacitor is subjected to Fourier expansion. More specifically, the periodic pulse voltage V(t) having predetermined periodicity and no sine waves is Fourier-expanded in terms of sine and cosine-wave series of high-order frequency components, as shown in Equation (1).

$$V(t)=V_0+\Sigma\{a_n \cos(n\omega t)+b_n \sin(n\omega t)\} \quad \text{Equation (1)}$$

$\omega$: angular speed of periodic pulse voltage V(t)
$a_n$: amplitude of n-order cosine-wave term
$b_n$: amplitude of n-order sine-wave term
$V_0$: DC component Next, the effective power Pe passing through the ceramic capacitor is calculated. Usually, when a capacitor is used for a circuit to which a periodic pulse voltage of a high frequency is applied, an equivalent circuit diagram of the capacitor shows a capacitor C in series with an equivalent series resistance R. Where the capacitance of the capacitor is determined as C(F), the equivalent series resistance thereof is determined as R($\Omega$), the impedance thereof is determined as Z($\Omega$), the phase angle thereof is determined as $\delta$, and the angular speed of a high-frequency sine-wave voltage is determined as $\omega$ (rad/s), Equation (2) is true.

$$\tan\delta = \frac{R}{1/\omega C} = \omega CR \quad \text{Equation (2)}$$

$$Z = \sqrt{R^2+\left(\frac{1}{\omega C}\right)^2} = \sqrt{\frac{(\omega CR)^2+1}{(\omega C)^2}} = \frac{1}{\omega C}\sqrt{1+(\tan\delta)^2}$$

If a voltage applied to the capacitor is determined as V(V) and a current flowing into the capacitor is determined as I (A), the effective power Pe (W) is equal to energy consumed by the equivalent series resistance R, as shown by Equation (3).

$$Pe=V\cdot I=R\cdot I^2=R\cdot(V/Z)^2 \quad \text{Equation (3)}$$

Subsequently, these Equations (2) and (3) lead to Equation (4).

$$Pe = R\cdot\left(\frac{V}{Z}\right)^2 = R\cdot V^2 \cdot \left(\frac{\omega C}{\sqrt{1+(\tan\delta)^2}}\right)^2 \quad \text{Equation (4)}$$

$$= \omega CR \cdot \frac{\omega CV^2}{1+(\tan\delta)^2} = \frac{\tan\delta}{1+(\tan\delta)^2}\omega CV^2$$

Here, the effective value of an n-order harmonic-component voltage is determined as Vrms in Equation (1). Since the cosine-wave term and the sine-wave term are independent of each other, Equations (5) and (6) is obtained. In Equations (5) and (6), a letter T means the periodicity of the n-order harmonic component, where an equation T=2π/nω holds.

Vrms of n-order cosine-wave component =

$$\sqrt{\frac{1}{T}\int_0^T \{a_n \cdot \cos(n\omega t)\}^2} = \frac{a_n}{\sqrt{2}}$$

Equation (5)

Vrms of n-order sine-wave component =

$$\sqrt{\frac{1}{T}\int_0^T \{b_n \cdot \sin(n\omega t)\}^2} = \frac{b_n}{\sqrt{2}}$$

Equation (6)

According to the above-described equations (4), (5), and (6), the effective power $Pe_n$ of the n-order harmonic component is expressed in Equation (7). In this equation, $C_n$ means the capacitance of the capacitor and tan $\delta_n$ means a dielectric tangent (tan $\delta$) thereof, where the n-order harmonic wave is $n\omega$.

$$Pe_n = \frac{\tan\delta_n}{1+(\tan\delta_n)^2} n\omega C_n \left\{ \left(\frac{a_n}{\sqrt{2}}\right)^2 + \left(\frac{b_n}{\sqrt{2}}\right)^2 \right\}$$

$$= \frac{\tan\delta_n}{1+(\tan\delta_n)^2} \cdot \frac{n\omega C_n}{2}(a_n^2 + b_n^2)$$

Equation (7)

Where a fundamental frequency of the periodic pulse voltage V(t) is determined as f, an equation $\omega = 2\pi f$ holds. By substituting $\omega$ into Equation (7), Equation (8) is obtained.

$$Pe_n = \frac{\tan\delta_n}{1+(\tan\delta_n)^2} \cdot n\pi f C_n(a_n^2 + b_n^2)$$

Equation (8)

In general, capacitors have very high insulation resistance values of at least about 100 MΩ. Therefore, the effective power of the DC component $V_0$ is negligible. Therefore, the effective power Pe of the periodic pulse voltage V(t) is calculated by summation of effective powers $Pe_n$ of harmonics, as shown in Equation (9).

$$Pe = \sum_{n=1}^{\infty} Pe_n = \pi f \sum_{n=1}^{\infty} \left\{ \frac{\tan\delta_n}{1+(\tan\delta_n)^2} \cdot nC_n(a_n^2 + b_n^2) \right\}$$

Equation (9)

Figure 2:
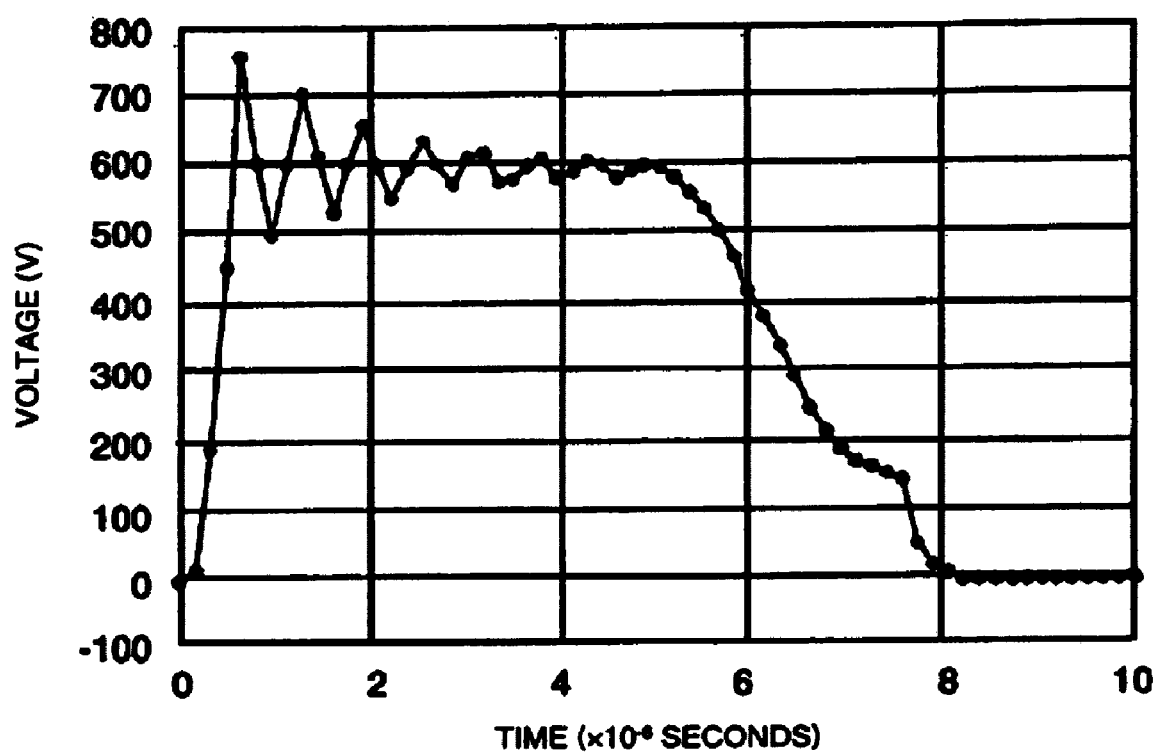
FIG. 2 is a graph illustrating a voltage waveform subjected to Fourier expansion.
Figure 3:
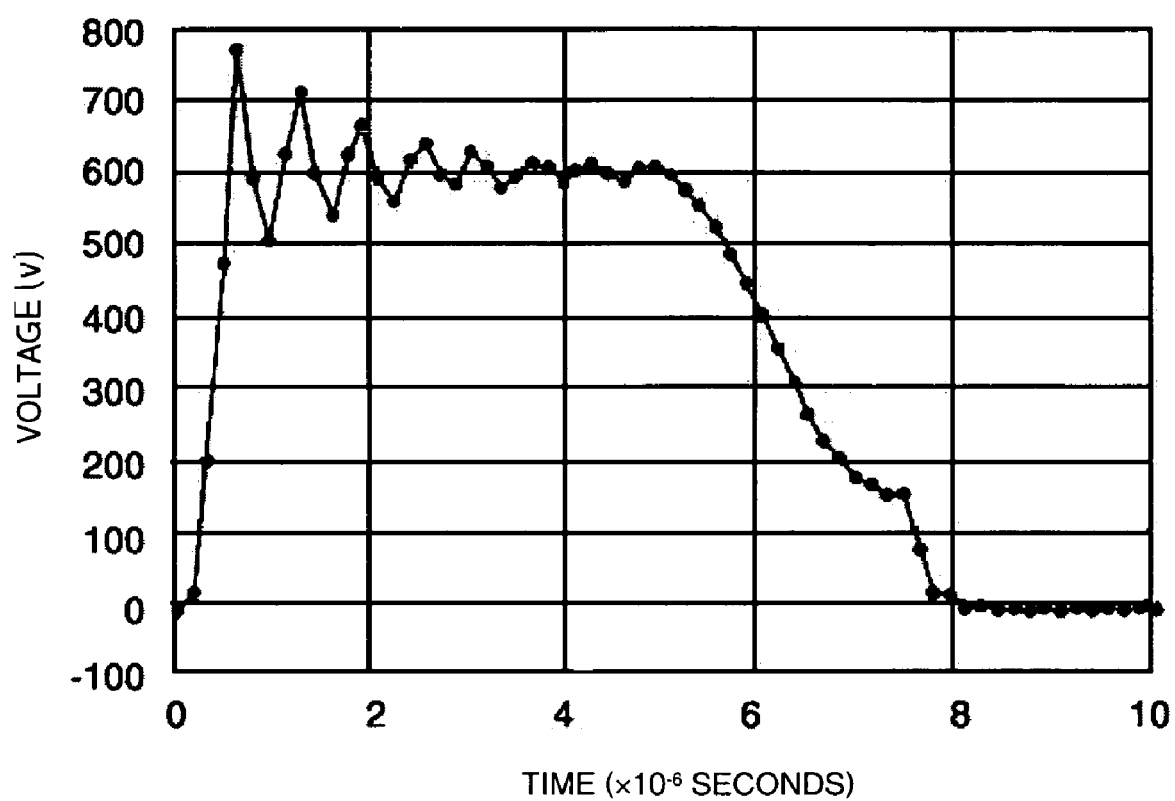
FIG. 3 is a graph illustrating a waveform generated by a DC component, and cosine and sine-wave components of from the first to thirty-first harmonics that are obtained by Fourier expansion.

According to this preferred embodiment, as shown in Table 1, Fourier expansion is performed for from the first to thirty-first harmonics (3100 kHz) so as to obtain the voltage value of cosine and sine-wave components of each of the harmonics. FIG. 2 is a graph illustrating a voltage waveform subjected to Fourier expansion. FIG. 3 is a graph illustrating a waveform generated by the synthesis of the cosine and sine-wave components of the harmonics from first to thirty-first obtained by Fourier expansion, and the DC component $V_0$, where an equation $V_0 = 363.5$ V holds.

TABLE 1

| n | Frequency [kHz] | Voltage [V] $a_n$ | $b_n$ |
|---|---|---|---|
| 1 | 100 | −174.8 | 287.5 |
| 2 | 200 | 9.1 | 103.7 |
| 3 | 300 | −48.8 | 42.0 |
| 4 | 400 | −27.5 | 30.8 |
| 5 | 500 | −41.4 | 8.7 |

TABLE 1-continued

| n | Frequency [kHz] | Voltage [V] $a_n$ | $b_n$ |
|---|---|---|---|
| 6 | 600 | −34.6 | 13.4 |
| 7 | 700 | −21.1 | 3.5 |
| 8 | 800 | −17.4 | −6.3 |
| 9 | 900 | −22.9 | −11.1 |
| 10 | 1000 | −16.7 | −7.8 |
| 11 | 1100 | −9.6 | −10.1 |
| 12 | 1200 | −6.2 | −15.4 |
| 13 | 1300 | −7.0 | −18.9 |
| 14 | 1400 | 0.8 | −18.0 |
| 15 | 1500 | 12.7 | −16.8 |
| 16 | 1600 | 25.5 | −6.9 |
| 17 | 1700 | 13.6 | 11.5 |
| 18 | 1800 | −0.9 | 10.7 |
| 19 | 1900 | 0.3 | 6.7 |
| 20 | 2000 | −1.2 | 3.8 |
| 21 | 2100 | −3.7 | 1.3 |
| 22 | 2200 | −5.0 | 0.9 |
| 23 | 2300 | −2.3 | 0.3 |
| 24 | 2400 | −1.4 | −0.8 |
| 25 | 2500 | −2.8 | −3.8 |
| 26 | 2600 | −2.3 | −3.2 |
| 27 | 2700 | −0.1 | −2.3 |
| 28 | 2800 | 1.5 | −3.5 |
| 29 | 2900 | 2.4 | −4.8 |
| 30 | 3000 | 2.5 | −1.7 |
| 31 | 3100 | 3.5 | −0.7 |

In general, $C_n$ and tan $\delta_n$ are functions of temperature, voltage, and frequency. If a voltage waveform applied to the both ends of the capacitor is determined, the voltage and frequency are determined by Fourier expansion. However, the temperature is not determined only by the voltage waveform. More specifically, if a current flows into the capacitor, the effective power consumed by the capacitor changes into thermal energy, such that heat is produced. Subsequently, the temperature of the capacitor increases to a predetermined point where the heating value and heatsinking value of the capacitor reach equilibrium.

The value of the effective power is required for determining the temperature of the capacitor, and the functions $C_n$ and tan $\delta_n$ are required for determining the effective power value. However, the temperature of the capacitor is required for determining the functions $C_n$ and tan $\delta_n$. In this case, therefore, the temperature of the capacitor cannot be determined. That is to say, the effective power Pe is determined by a temperature function Pe=f (temperature), but the temperature is unknown.

In this preferred embodiment, to overcome the above-described problems, this temperature is a temperature at which the effective power Pe and the heatsinking value reach equilibrium. First, the equilibrium temperature of the capacitor, where the atmospheric temperature is about 25° C., is measured by using a plurality of high-frequency sine waves. Since $C_n$ and tan $\delta_n$ are functions of the temperature, voltage, and frequency, they are determined by sine-wave conditions (the voltage and frequency) and the equilibrium temperature (a measured value). Since the waveform of the high-frequency voltage applied to the capacitor is sine waves, Fourier expansion is not required to obtain the sum of effective powers $Pe_n$. Subsequently, $C_n$ and tan $\delta_n$ (n=1) are substituted into Equation (8) so as to obtain effective power Pe for each of the sine waves. The relationship between the equilibrium temperature of the capacitor (a measured value) and the effective power Pe of each of the sine waves is expressed in a regression formula so as to obtain the effective power Pe (a regression value) at a predetermined equilibrium temperature. Since the waveform of the high-frequency voltage applied to the capacitor is sine waves, the value of cosine-wave amplitude a is zero in Equation (8). Subsequently, the following equation is obtained, where n=1 is omitted.

$$Pe = \frac{\tan\delta}{1 + (\tan\delta)^2} \cdot \pi f C b^2$$

⑦ $1 + (\tan\delta)^2$

⑦ indicates text missing or illegible when filed

The relationship between the equilibrium temperature of the capacitor and the effective power Pe (a regression value) is shown in Table 2 (see data shown in the center column of Table 2).

TABLE 2

| Equilibrium temperature of Capacitor [° C.] | Effective power Pe [W] | |
|---|---|---|
| | Regression value obtained from actual measured value for sine wave | Value obtained by Fourier analysis on pulse waveform |
| 40 | 0.166 | 0.527 |
| 41 | 0.175 | 0.502 |
| 42 | 0.184 | 0.477 |
| 43 | 0.193 | 0.453 |
| 44 | 0.202 | 0.430 |
| 45 | 0.210 | 0.408 |
| 46 | 0.218 | 0.387 |
| 47 | 0.226 | 0.367 |
| 48 | 0.234 | 0.348 |
| 49 | 0.242 | 0.330 |
| 50 | 0.249 | 0.313 |
| 51 | 0.257 | 0.296 |
| 52 | 0.264 | 0.281 |
| 52.2 | 0.265 | 0.278 |
| 52.4 | 0.267 | 0.275 |
| 52.6 | 0.268 | 0.272 |
| 52.8 | 0.270 | 0.270 |
| 53 | 0.271 | 0.267 |
| 54 | 0.278 | 0.253 |
| 55 | 0.285 | 0.241 |
| 56 | 0.291 | 0.229 |
| 57 | 0.298 | 0.218 |
| 58 | 0.304 | 0.208 |
| 59 | 0.311 | 0.198 |
| 60 | 0.317 | 0.189 |
| 61 | 0.323 | 0.181 |
| 62 | 0.329 | 0.172 |
| 63 | 0.335 | 0.164 |
| 64 | 0.341 | 0.157 |
| 65 | 0.347 | 0.149 |

The voltage value and frequency of the capacitor are obtained from the waveform of the periodic pulse voltage applied to the both ends of the capacitor. Since the equilibrium temperature of the capacitor determined by this periodic-pulse-voltage waveform is unknown, a plurality of provisional temperatures are determined and $C_n$ and $\tan\delta_n$ for each of the provisional temperatures are determined. If the periodic pulse voltages have sine waves, where Fourier expansion is not required to obtain the sum of effective powers $Pe_n$, these $C_n$ and $\tan\delta_n$ are substituted into Equation (8) for calculating effective power Pe (a calculation value). Subsequently, the effective power Pe (the calculation value) at each temperature corresponding to the periodic pulse voltage is obtained. The calculation results are shown in the right column of Table 2. The equilibrium temperature of the capacitor is a temperature at which one of the effective powers Pe (the calculation values) is approximately equal to one of the effective powers Pe (the regression values) obtained from the regression formula. These effective powers are equivalent to a target effective power Pe corresponding to the periodic-pulse voltage waveform.

Figure 4:
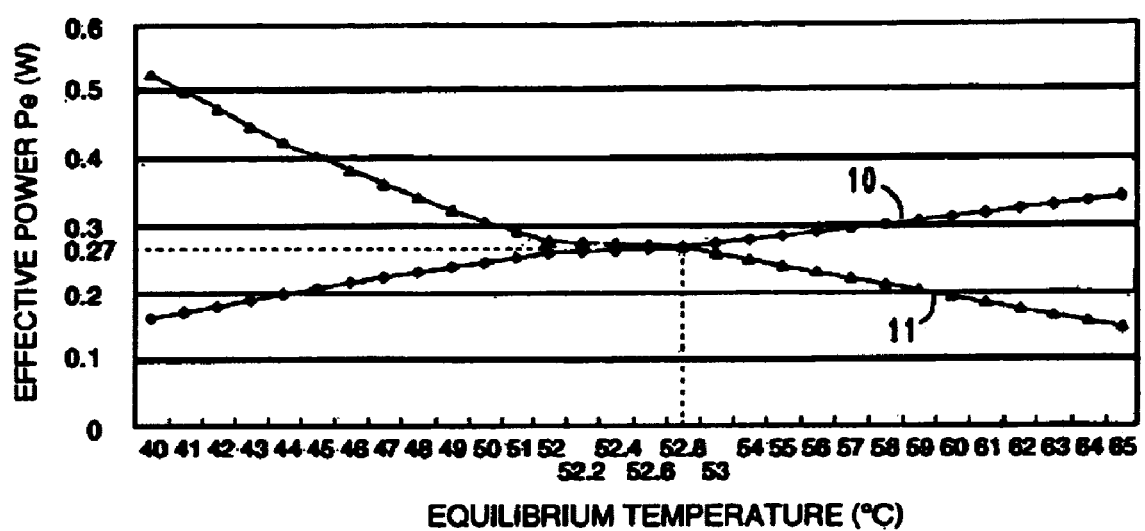
FIG. 4 is a graph illustrating regression values obtained from measured values for sine waves and values obtained by Fourier analysis on a periodic pulse-voltage waveform.

FIG. 4 is a graph illustrating the effective powers Pe (the regression values) obtained from the regression formula by using the actual measured values of the sine waves (see solid line 10). This graph also illustrates the effective powers Pe (the calculation values) obtained by Fourier analysis on the periodic pulse-voltage waveform (see solid line 11). The intersection point of the solid line 10 and the solid line 11 indicates the target effective power Pe corresponding to the periodic pulse voltage and the equilibrium temperature of the capacitor. The solid line 10 is a curve that is unique to this capacitor. The solid line 11 is a curve which is dependent upon the frequency of the period pulse-voltage waveform. More specifically, the distance between the solid line 11 and the origin, and the equilibrium temperature indicated by the intersection point of the solid line 11 and the solid line 10 increases as the order n of the n-order harmonic increases. Conversely, the distance between the solid line 11 and the origin, and the equilibrium temperature indicated by the intersection point of the solid line 11 and the solid line 10 decrease as the order n of the n-order harmonic decreases. According to this preferred embodiment, the equilibrium temperature of the capacitor is approximately 52.8° C. and the effective power Pe consumed by the capacitor is approximately 0.27 W. When a switching power supply is actually used at the atmospheric temperature of approximately 25° C., the equilibrium temperature of the capacitor is approximately 51.3° C., which is measured by a K thermocouple with a diameter of approximately 0.1 mm.

Thus, the above-described preferred embodiment obtains the effective power Pe consumed by the ceramic capacitor used for the snubber circuit to which the periodic pulse voltage V(t) having the trapezoidal waves is applied. Subsequently, the time required to measure the effective power Pe consumed by the ceramic capacitor is greatly reduced.

Figure 5:
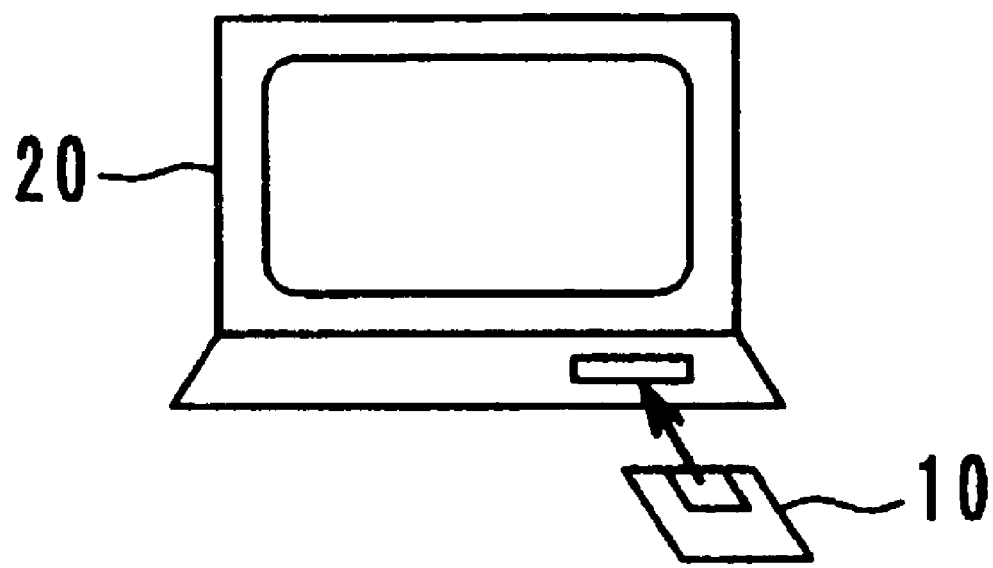
FIG. 5 schematically shows an example of a calculation apparatus for calculating effective power relating to a capacitor and an example of a recording medium storing a calculation program therefor according to a preferred embodiment of the present invention.
Figure 6:
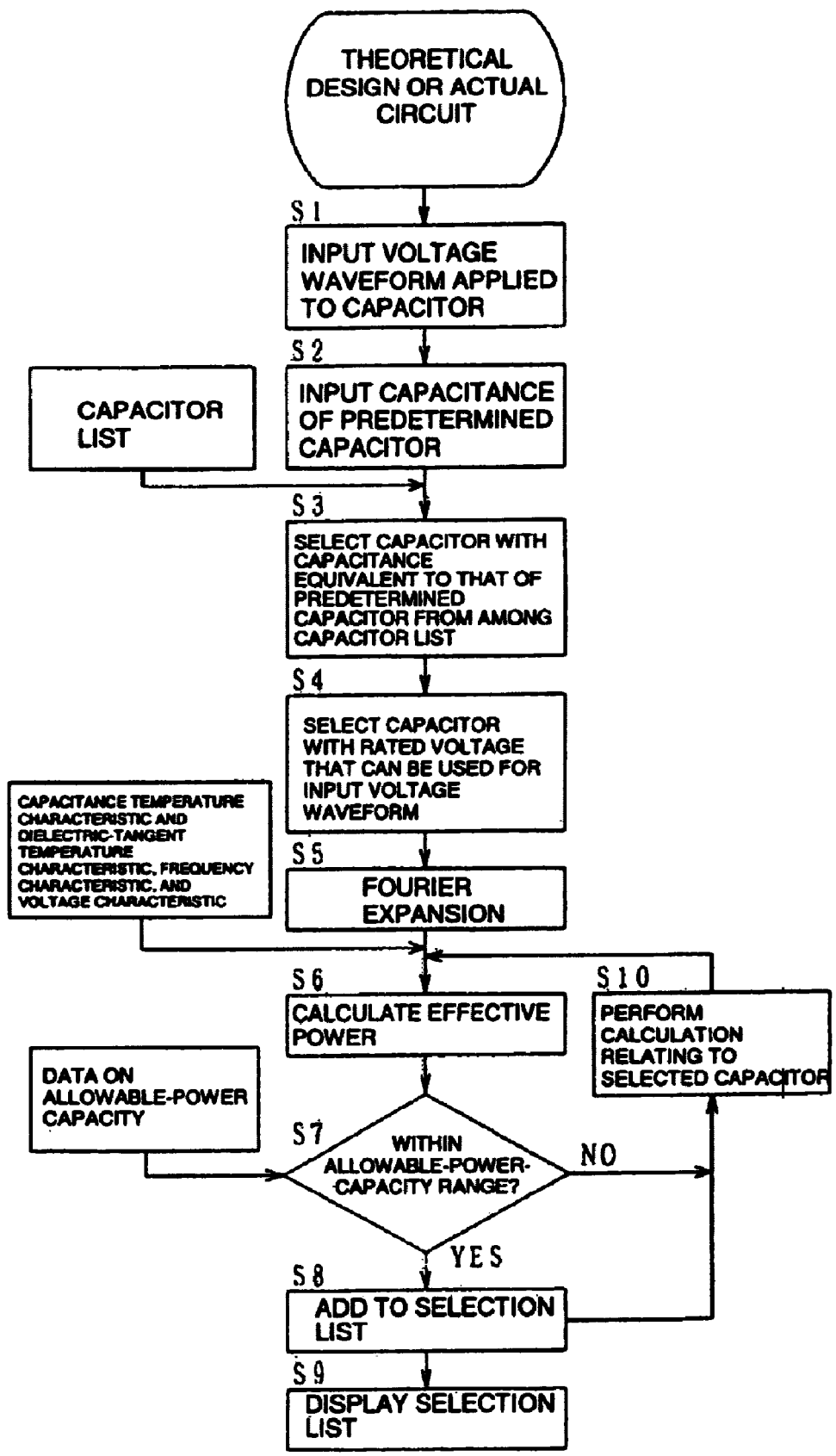
FIG. 6 is a flowchart illustrating an example of a method of calculating the effective power relating to the capacitor and an example of a capacitor selection method according to another preferred embodiment of the present invention.

FIG. 5 shows a flexible disk 10 which defines a recording medium for storing a capacitor selection method and a program for calculating the effective power related to the capacitor. Of course, a CD-ROM or other suitable medium can be used in place of the flexible disk 10. A computer 20 transfers and installs the capacitor selection method and the program for calculating the effective power related to the capacitor onto a CPU provided therein to perform calculations. FIG. 6 is a flowchart illustrating an example program installed on the computer 20.

The flexible disk 10 stores data regarding the names of a plurality of capacitors, the allowable power capacities, temperature characteristics of capacitances $C_n$ and dielectric tangents $\tan\delta_n$, voltage characteristics and frequency characteristics of the capacitors, and a program that sets a predetermined periodic-voltage waveform. The flexible disk 10 also stores a method of measuring the effective power consumed by a capacitor shown in the flowchart of FIG. 6 and a program for the capacitor selection method.

Figure 7:
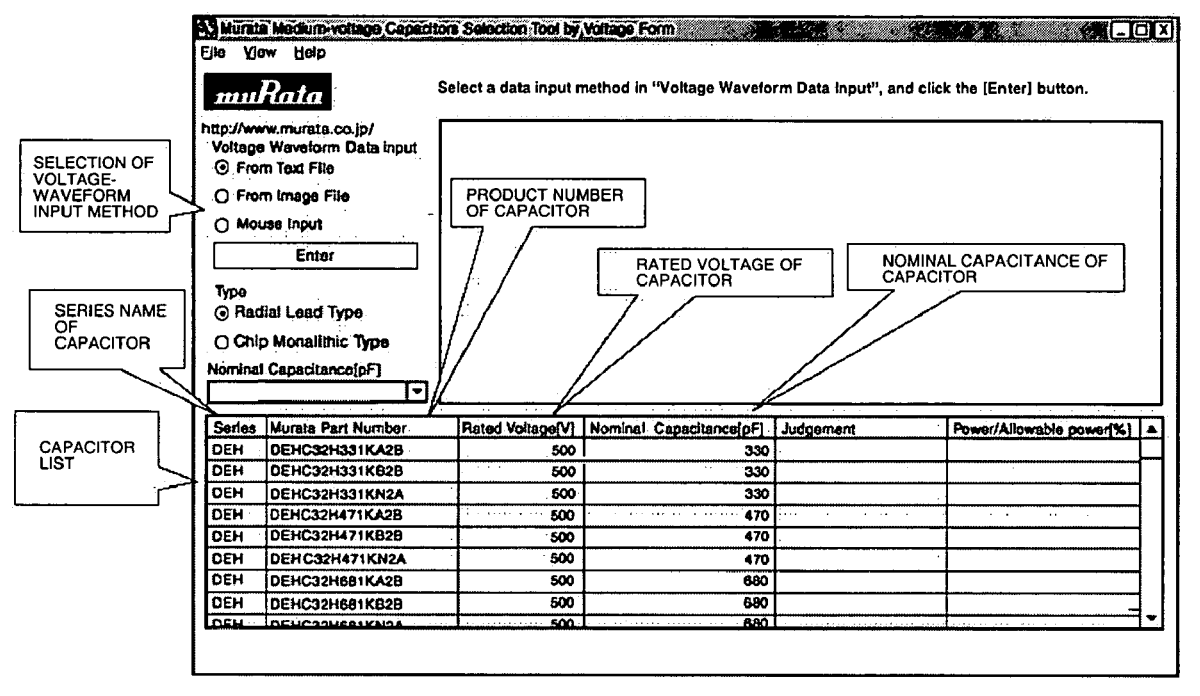

When this program is started, an initial image shown in FIG. 7 is produced on a display of the computer 20. Voltage waveform data input, that is, a voltage-waveform determination portion where a voltage applied to the capacitor is determined, is displayed at the upper-left corner of a screen of the display. In this portion, the waveform of a periodic voltage applied to the capacitor is determined via a text file, an image file, or a mouse of the computer 20 (see step S1 of the flowchart of FIG. 6). A list of the capacitors is displayed on the lower portion of the screen. This list shows the series names, product numbers, rated voltages, and nominal capacitances of the capacitors.

Figure 8:
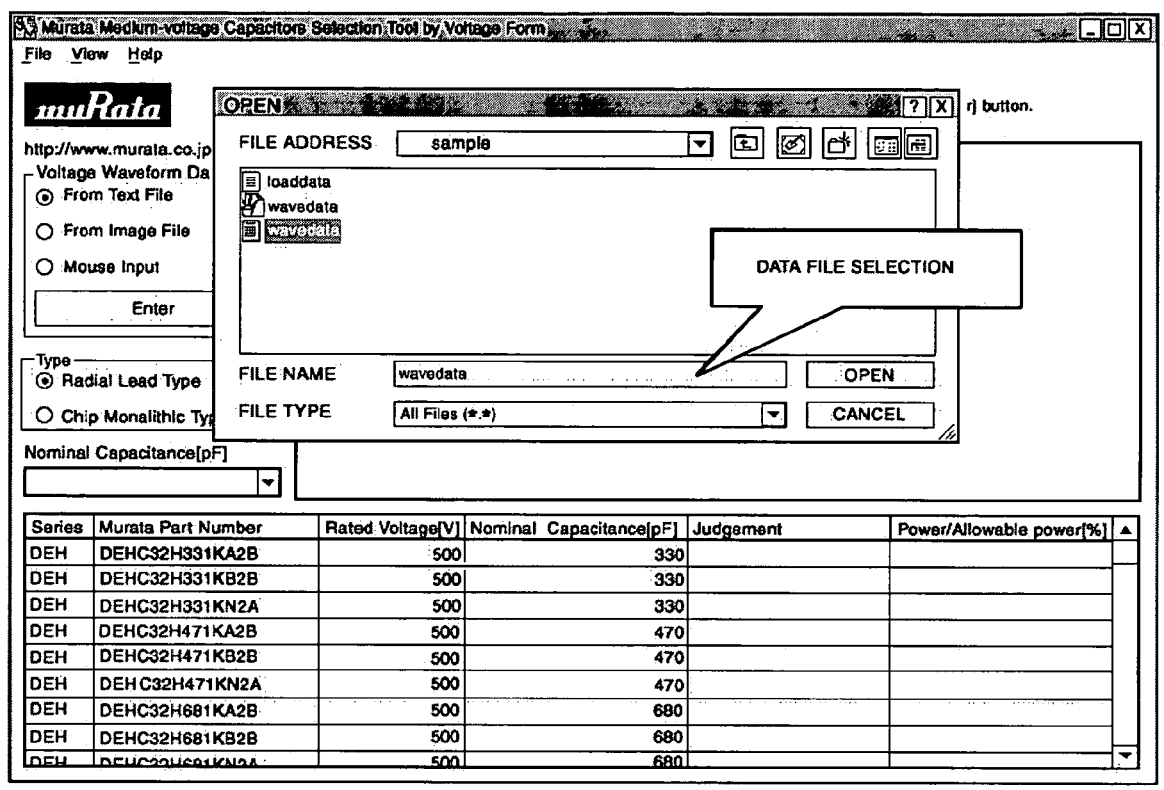
FIG. 8 illustrates an example image produced when the periodic-voltage waveform applied to both ends of the capacitor is input, as numerical data on time and voltage.

If the voltage waveform is input via the text file, an image shown in FIG. 8 is displayed on the screen. A predetermined data file is selected among a plurality of data files stored in the computer 20, and numeric data regarding time and voltage is input to set a predetermined periodic voltage waveform.

Figure 9:
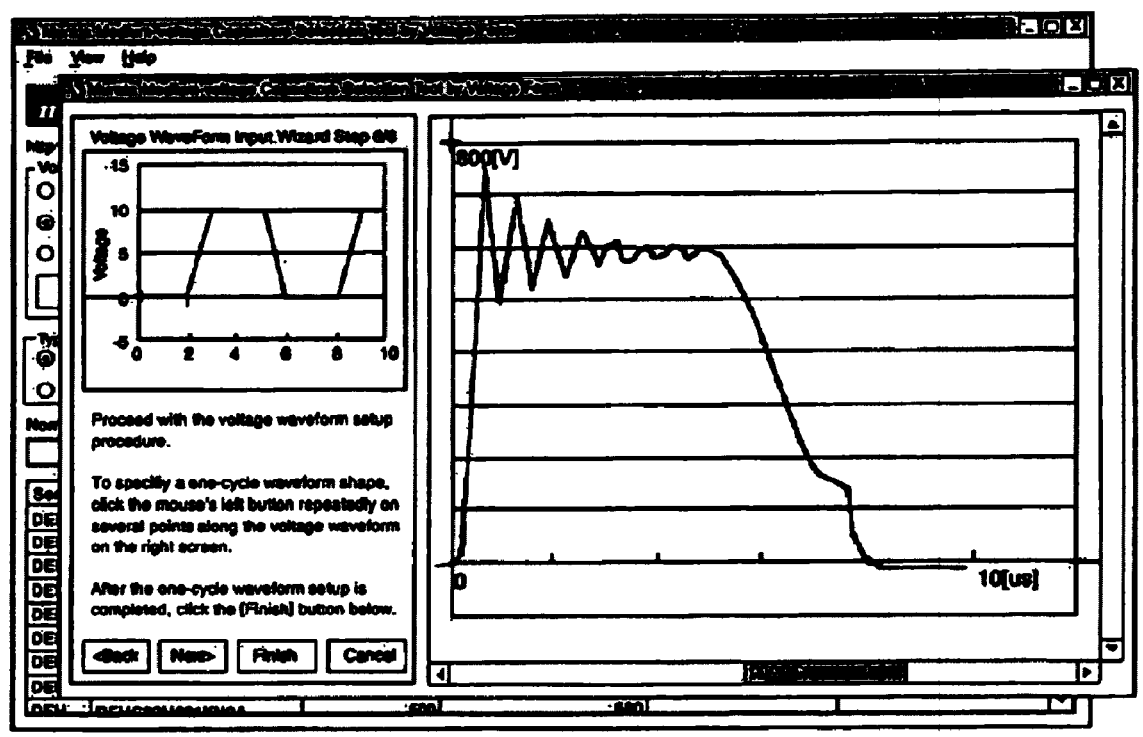
FIG. 9 illustrates an example image produced when the image data on the periodic voltage waveform applied to the both ends of the capacitor is traced by using a mouse and input.
Figure 10:
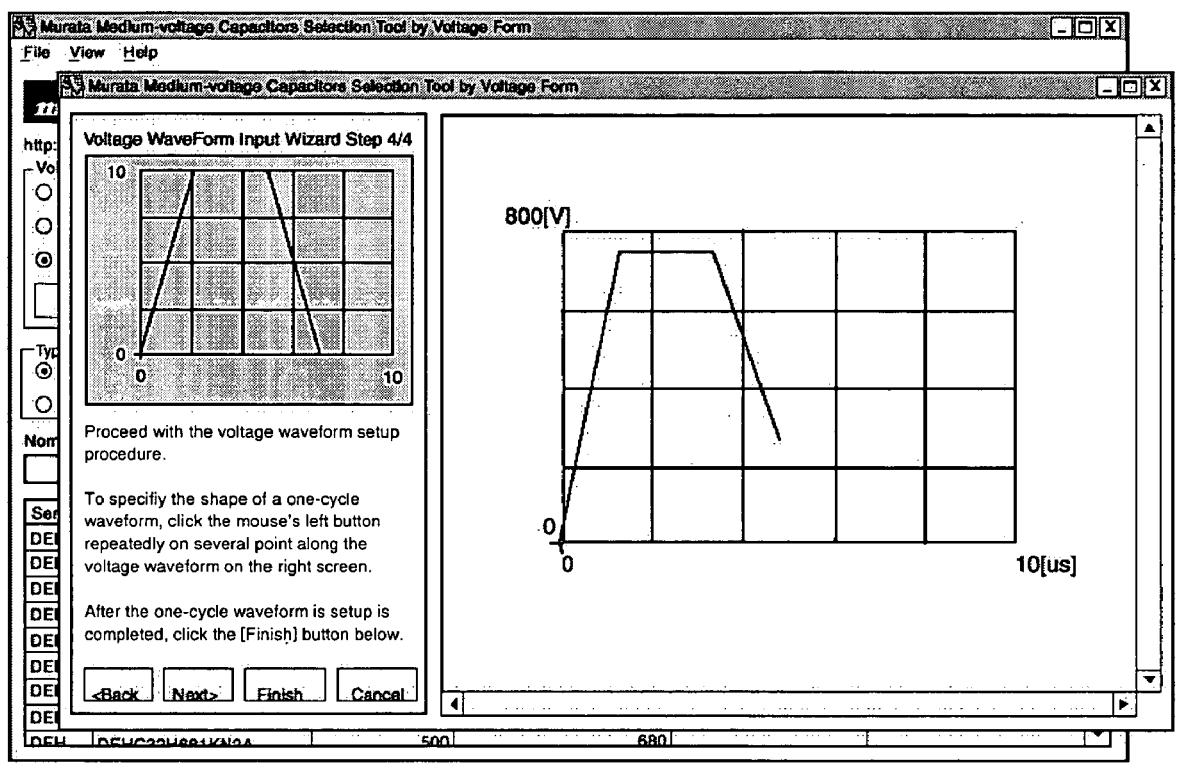
FIG. 10 illustrates an example image produced when the periodic voltage waveform applied to the both ends of the capacitor is input by using the mouse.

If the voltage waveform is input via the image file, an image shown in FIG. 9 is displayed on the screen. Image data on the periodic voltage waveform is input to the computer 20 directly from a measuring device connected thereto, from the measuring device connected thereto via a network, or via a recording medium such as a flexible disk storing the data generated by the measuring device. This image data is traced by using a mouse to set the periodic voltage waveform. When the voltage waveform is input by using a mouse, an image shown in FIG. 10 is displayed on the screen.

Figure 11:
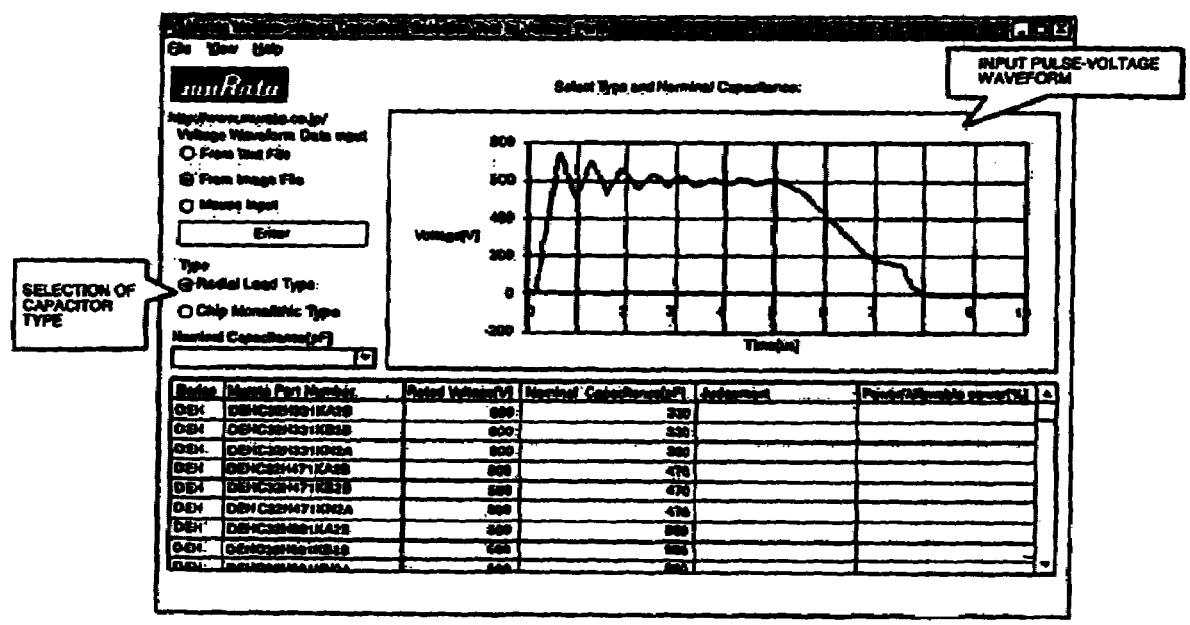
FIG. 11 illustrates an example image produced after the periodic voltage waveform applied to the both ends of the capacitor is input.

After the voltage waveform is input, an image shown in FIG. 11 is displayed on the screen. Next, the type of a predetermined capacitor for a theoretical design, or for an actual circuit, is input via a keyboard or the mouse of the computer 20. More specifically, either a lead-terminal type or a chip lamination type is selected.

Figure 12:
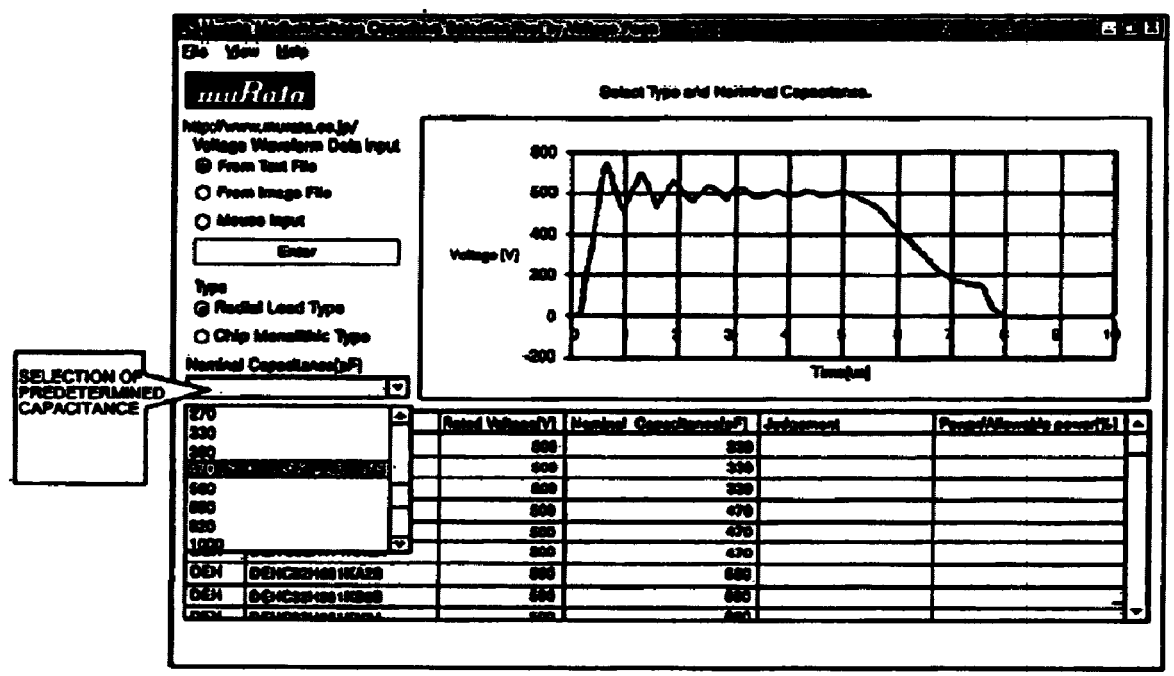
FIG. 12 illustrates another example image produced after the periodic voltage waveform applied to the both ends of the capacitor is input, the example image following the image shown in FIG. 11.

Next, the capacitance of a desired capacitor is input, as shown in FIG. 12, via the keyboard or the mouse (see step S2 shown in the flowchart of FIG. 6). Subsequently, the CPU of the computer 20 selects information about a capacitor having the capacitance in accordance with the input capacitance (see step S3 shown in the flowchart of FIG. 6) from the list. Further, the CPU selects at least one capacitor having a rated voltage that is suitable for use with the input periodic voltage waveform (see step S4 shown in the flowchart of FIG. 6).

Then, the CPU of the computer 20 performs Fourier expansion and calculations to obtain the effective power, as shown in steps S5 and S6 in the flowchart of FIG. 6. The details of the Fourier expansion and the effective-power calculation, which have already been described, are omitted. The data regarding the temperature characteristics of the capacitances $C_n$ and dielectric tangents $\tan \delta_n$, and the voltage characteristics and the frequency characteristics of each of the capacitors that are installed on the computer 20 are transferred to the CPU of the computer 20 and used for the calculations. Subsequently, effective powers Pe at equilibrium temperatures of the capacitor selected at step S4 are obtained from regression values calculated from measured values for the sine waves (see the center column of Table 2). The equilibrium temperatures are obtained. The effective powers Pe are compared with the effective powers Pe obtained by Fourier analysis on the pulse waveforms for each of the provisional temperatures (see the right column of Table 2), and one of the effective powers Pe shown in the center column matches one of the effective powers Pe shown in the right column, as shown in Table 2. The equilibrium temperature at which both of the effective powers Pe correspond to each other is a target equilibrium temperature of the capacitor. And, the effective power then is the effective power Pe (a calculation value) consumed by the capacitor.

Then, whether or not the effective power (the calculation value) consumed by the capacitor falls within a predetermined range of the allowable power capacities of the capacitors is determined (see step S7 shown in the flowchart of FIG. 6). If the effective power (the calculation value) consumed by the capacitor falls outside this range, it is determined that this capacitor is not available. If the effective power falls within this range, it is determined that this capacitor is available and the process proceeds to step S8 such that the capacitor is added to the selection list. Further, feedback is performed at step S10 until the results on whether or not the capacitors are available are obtained for all the capacitors selected at step S4.

Figure 13:
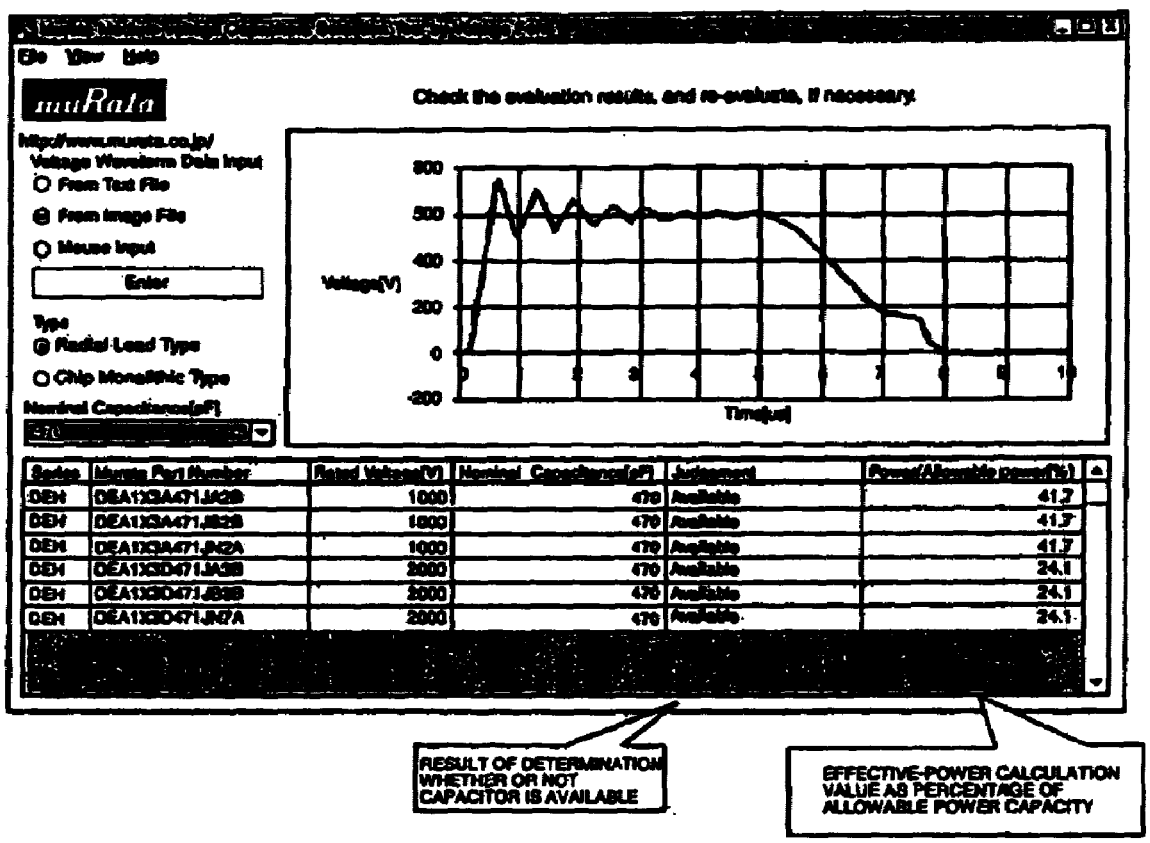
FIG. 13 illustrates an example image displaying a result of determination whether or not the capacitor is available.

When the capacitor selection is completed, the image of the capacitor selection list (a list showing the results of determination on availability) is displayed on the screen of the display, as shown in FIG. 13. This list also shows the effective powers (the calculation values) in percentages of the allowable power capacities. Subsequently, an available capacitor is selected and displayed only by inputting the nominal capacitance of a predetermined capacitor and the waveform of a periodic voltage applied to both ends of the capacitor.

Figure 14:
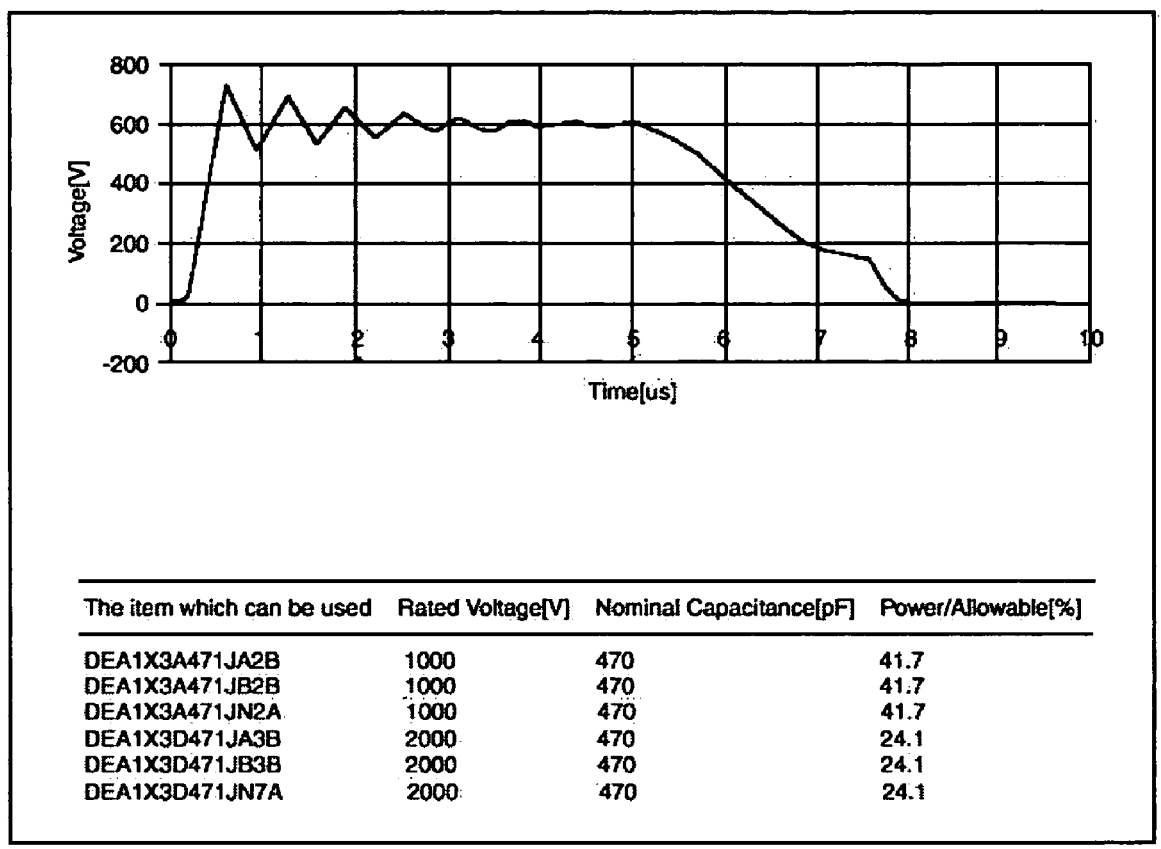
FIG. 14 illustrates an example of a printed output of an analytical result.

These obtained results are printed by preferably using a printing device such as a printer, as shown in FIG. 14, such that the analysis results can be confirmed later. Further, the set values are also printed together with the analysis results, such that they can be analyzed together.

The above-described program is preferably stored in a recording medium, such as a CD-ROM, or any other suitable storage medium or device. Therefore, via a CD-ROM program to perform the method of preferred embodiments of the present invention, the program can be installed on a personal computer, whereby the personal computer functions as a calculation device for calculating effective power passing through a capacitor. This program may also be downloaded from a predetermined home page.

The present invention is not limited to the above-described preferred embodiments, but can be modified variously within the scope thereof. In the above-described preferred embodiments, the ceramic capacitor is used, but various types of capacitors can be used as long as the temperature characteristics of capacitances and dielectric tangents, and the voltage characteristics and frequency characteristics of the capacitors are known. Further, a periodic voltage with arbitrary waveform can be used including a trapezoidal wave, a square wave, and a sawtooth wave. Of course, the present invention can be used even though the waveform of the periodic voltage has sine waves.

The present invention is not limited to each of the above-described preferred embodiments, and various modifications are possible within the range described in the claims. An embodiment obtained by appropriately combining technical features disclosed in each of the different preferred embodiments is included in the technical scope of the present invention.

What is claimed is:

1. A method of calculating effective power relating to a capacitor, comprising the steps of:

obtaining a equilibrium temperature of the capacitor for each of a plurality of sine waves, and substituting a first capacitance and a first dielectric tangent of the capacitor for each of a plurality of equilibrium temperatures into the following equation:

$$Pe = \frac{\tan\delta}{1 + (\tan\delta)^2} \cdot \pi f C b^2$$

Pe: effective power
$\tan \delta$: dielectric tangent

C: capacitance
f: frequency
b: sine-wave amplitude
in order to obtain a first effective power for each of the equilibrium temperatures;

obtaining a voltage value and a frequency from the waveform of a periodic voltage applied to both ends of the capacitor, and setting a plurality of provisional temperatures, and obtaining a second capacitance and a second dielectric tangent for each of the provisional temperatures, and substituting the second capacitance and the second dielectric tangent into the following equation:

$$Pe = \frac{\tan\delta}{1 + (\tan\delta)^2} \cdot \pi fC(a^2 + b^2)$$

Pe: effective power
tan δ: dielectric tangent
C: capacitance
f: frequency
a: cosine-wave amplitude
b: sine-wave amplitude
in order to obtain second effective power corresponding to the periodic voltage for each of the provisional temperatures;

determining a temperature at which the first effective power is approximately equal to the second effective power as a target equilibrium temperature of the capacitor; and determining the first and second effective powers corresponding to the target equilibrium temperature as a target effective power corresponding to the periodic voltage.

2. A method of calculating effective power relating to a capacitor according to claim 1, wherein the step of calculating the second effective power comprises the steps of:

performing Fourier expansion for the periodic voltage;
calculating effective power for each of a plurality of harmonics; and
determining the sum of the calculated effective powers of the harmonics as the second effective power corresponding to the periodic voltage.

3. A method of measuring effective power consumed by a capacitor, wherein a periodic voltage is applied to the capacitor, and the waveform of the periodic voltage applied to both ends of the capacitor is measured, and the effective power consumed by the capacitor is calculated from the measured waveform of the periodic voltage using the method of calculating the effective power relating to the capacitor according to claim 1.

4. A method of selecting a capacitor, comprising the steps of:

obtaining an equilibrium temperature of the capacitor for each of a plurality of sine waves, and substituting a first capacitance and a first dielectric tangent of the capacitor for each of a plurality of equilibrium temperatures into the following equation:

$$Pe = \frac{\tan\delta}{1 + (\tan\delta)^2} \cdot \pi fCb^2$$

Pe: effective power
tan δ: dielectric tangent
C: capacitance
f: frequency
b: sine-wave amplitude
in order to obtain a first effective power for each of the equilibrium temperatures;

obtaining a voltage value and a frequency from the waveform of a periodic voltage applied to both ends of the capacitor, and setting a plurality of provisional temperatures, and obtaining a second capacitance and a second dielectric tangent for each of the provisional temperatures, and substituting the second capacitance and the second dielectric tangent into the following equation:

$$Pe = \frac{\tan\delta}{1 + (\tan\delta)^2} \cdot \pi fC(a^2 + b^2)$$

Pe: effective power
tan δ: dielectric tangent
C: capacitance
f: frequency
a: cosine-wave amplitude
b: sine-wave amplitude
in order to obtain a second effective power corresponding to the periodic voltage for each of the provisional temperatures;

determining a temperature at which the first effective power is approximately equal to the second effective power as a target equilibrium temperature of the capacitor, and determining the first and second effective powers corresponding to this target equilibrium temperature as a target effective power corresponding to the periodic voltage; and comparing the target effective power corresponding to the periodic voltage with an allowable power capacity of the capacitor in order to determine whether or not the capacitor is available.

* * * * *